United States Patent
Moon et al.

(10) Patent No.: US 7,951,698 B2
(45) Date of Patent: May 31, 2011

(54) METHOD OF FABRICATING ELECTRONIC DEVICE USING NANOWIRES

(75) Inventors: Seung Eon Moon, Daejeon (KR); Eun Kyoung Kim, Daejeon (KR); Hong Yeol Lee, Chungcheongbuk-do (KR); Jong Hyurk Park, Daegu (KR); Kang Ho Park, Daejeon (KR); Jong Dae Kim, Daejeon (KR); So Jeong Park, Gyeonggi-do (KR); Gyu Tae Kim, Seoul (KR)

(73) Assignees: Electronics and Telecommunications Research Institute, Daejeon (KR); Korea University Industrial & Academic Collaboration Foundation, Seoul (KR)

( * ) Notice: Subject to any disclaimer, the term of this patent is extended or adjusted under 35 U.S.C. 154(b) by 281 days.

(21) Appl. No.: 11/947,139

(22) Filed: Nov. 29, 2007

(65) Prior Publication Data

US 2008/0132052 A1 Jun. 5, 2008

(30) Foreign Application Priority Data

Dec. 5, 2006 (KR) .................. 10-2006-0122348
Jun. 22, 2007 (KR) .................. 10-2007-0061450

(51) Int. Cl.
*H01L 45/00* (2006.01)
*H01L 21/00* (2006.01)

(52) U.S. Cl. ............. 438/597; 257/211; 257/76; 422/98

(58) Field of Classification Search .................. 205/766
See application file for complete search history.

(56) References Cited

U.S. PATENT DOCUMENTS 5,446,959 A * 9/1995 Kim et al. ............... 29/827

(Continued)

FOREIGN PATENT DOCUMENTS

JP 2004-136377 * 5/2004

(Continued)

OTHER PUBLICATIONS

"Simple selective electron beam patterning on a single nanowire," Kanghyun Kim, Haeyong Kang, Jung Hwan Huh, and Gyu Tae Kim, School of Electrical Engineering, Korea University, Anam-dong, Sungbuk-gu, Seoul, 136-701, Korea; 2006 NMDC, Oct. 25, 2006; vol. 1, pp. 408 and 409.

(Continued)

*Primary Examiner* — Thanh V Pham
*Assistant Examiner* — Mohammad Choudhry
(74) *Attorney, Agent, or Firm* — Rabin & Berdo, P.C.

(57) ABSTRACT

A method of fabricating an electronic device using nanowires, minimizing the number of E-beam processing steps and thus improving a yield, includes the steps of: forming electrodes on a substrate; depositing a plurality of nanowires on the substrate including the electrodes; capturing an image of the substrate including the nanowires and the electrodes; drawing virtual connection lines for connecting the nanowires with the electrodes on the image using an electrode pattern simulated through a computer program, after capturing the image; coating an E-beam photoresist on the substrate; removing the photoresist from regions corresponding to the virtual connection lines and the electrode pattern using E-beam lithography; depositing a metal layer on the substrate after removing the photoresist from the regions of the virtual connection lines; and removing remaining photoresist from the substrate using a lift-off process.

12 Claims, 8 Drawing Sheets

U.S. PATENT DOCUMENTS

| | | | |
|---|---|---|---|
| 5,612,853 A * | 3/1997 | Kim et al. ................... | 361/723 |
| 6,762,131 B2 * | 7/2004 | Lim et al. ................... | 438/719 |
| 6,831,017 B1 | 12/2004 | Li et al. | |
| 7,202,100 B1 * | 4/2007 | Kubena et al. ............... | 438/51 |
| 7,211,503 B2 * | 5/2007 | Chen et al. ................... | 438/597 |
| 7,399,691 B2 * | 7/2008 | Lieber et al. ................. | 438/597 |
| 2003/0189202 A1 * | 10/2003 | Li et al. ....................... | 257/14 |
| 2005/0129844 A1 * | 6/2005 | Legzdins et al. ............ | 427/180 |
| 2006/0189112 A1 * | 8/2006 | Chen et al. ................... | 438/597 |
| 2006/0211183 A1 * | 9/2006 | Duan et al. ................... | 438/149 |
| 2007/0099335 A1 * | 5/2007 | Gangopadhyay et al. ..... | 438/99 |
| 2007/0128808 A1 * | 6/2007 | Choi et al. ................... | 438/270 |
| 2007/0140946 A1 * | 6/2007 | Gabriel et al. ............... | 423/447.1 |
| 2007/0145542 A1 * | 6/2007 | Tsakalakos ................... | 257/659 |
| 2007/0151099 A1 * | 7/2007 | Tsakalakos ................... | 29/846 |
| 2008/0003839 A1 * | 1/2008 | Park et al. ................... | 438/800 |
| 2008/0108172 A1 * | 5/2008 | Xi et al. ....................... | 438/99 |
| 2008/0182068 A1 * | 7/2008 | Melechko et al. ............ | 428/119 |
| 2008/0182388 A1 * | 7/2008 | Hasegawa et al. ............ | 438/466 |
| 2008/0191317 A1 * | 8/2008 | Cohen et al. ................. | 257/618 |
| 2008/0233675 A1 * | 9/2008 | Lee et al. ...................... | 438/104 |
| 2009/0129004 A1 * | 5/2009 | Gruner ........................ | 361/679.21 |
| 2009/0170186 A1 * | 7/2009 | Wu et al. ..................... | 435/286.1 |

FOREIGN PATENT DOCUMENTS

| | | |
|---|---|---|
| JP | 2005-277182 | 10/2005 |
| KR | 2005-0116925 | 12/2005 |
| KR | 2006-0105949 | 10/2006 |

OTHER PUBLICATIONS

"Enhanced voltage-current characteristics of GaN nanowires treated by a selective reactive ion etching," D.Y. Jeon, K. H. Kim, S. J. Park, J. H. Huh, H. Y. Kim, C. Y. Yim, and G. T. Kim, School of Electrical Engineering, Korea University, Seoul, 136-701, Korea, Jul. 12, 2006; Applied Physics Letters, vol. 89, pp. 023108-1, 023108-2 and 023108-3.

\* cited by examiner

METHOD OF FABRICATING ELECTRONIC DEVICE USING NANOWIRES

CROSS-REFERENCE TO RELATED APPLICATION

This application claims priority to and the benefit of Korean Patent Application No. 2006-122348, filed Dec. 5, 2006, and No. 2007-61450, filed Jun. 22, 2007, the disclosure of which is incorporated herein by reference in its entirety.

BACKGROUND

1. Field of the Invention

The present invention relates to a method of fabricating an electronic device using nanowires. More particularly, the present invention relates to a method of fabricating an electronic device using nanowires, capable of reducing the number of E-beam processing steps and enhancing product yields by using virtual computer-simulated electrode patterns.

The present invention has been produced from the work supported by the IT R&D program of MIC (Ministry of Information and Communication)/IITA (Institute for Information Technology Advancement) [2006-S-006-01, Components/Module technology for Ubiquitous Terminals] in Korea.

2. Discussion of Related Art

Since the development of the transistor in 1948 as an amplifying component using conductive activation in semiconductor crystalline structures, transistors have been widely being used in a variety of electronic applications such as memories or sensors. In recent years, semiconductor technologies have been geared more toward higher integration density with scale-down and lower product costs as the most important factors. Nanotechnology is now used in the semiconductor industry for the scaling-down of semiconductor devices. Low-dimensional nano-materials have different bulk and electrical, optical, chemical, and thermal characteristics due to a high ratio of surface area to volume and an effect of quantum confinement.

After confirmation by Iijima in 1991 that carbonic nanotubes (CNT) are available for use in electronic devices, numerous studies on nanowires have been proceeding vigorously. However, nanowires are regarded as insufficient in electrical uniformity and in product yield relevant to process stability and reproducibility of electronic devices using nanowires, which makes nanowire electronic devices disadvantageous to electronic device applications and mass-production. Nowadays, fabrication processes of electronic devices using nanowires generally employ patterning techniques using photolithography, electron beam (E-beam), ionic beam, X-ray, and an atomic force microscope (AFM). Research into applications of nanowires for electronic devices or integrated circuits with the above patterning techniques is actively progressing. Among said research, photolithography is most commonly used for patterning the nanowires.

Photolithography, which is a general technique for fabricating an electronic device using nanowires, includes depositing nanowires on a substrate, and forming metallic electrodes thereon through a photographic process. However, as photolithography requires E-beam or ionic beam to be used plural times, it increases the number of processing steps and degrades product yield significantly.

SUMMARY OF THE INVENTION

The present invention is directed to a method of fabricating electronic devices using nanowires, reducing the number of processing steps with beam and hence raising product yields thereof, as compared to a conventional method.

The present invention is also directed to a method of fabricating an electronic device using nanowires, capable of estimating electrical characteristics of the nanowires by means of a single nanowire.

The present invention is further directed to a method of fabricating easily practicable electronic devices using nanowires in a wafer unit by using a computer program.

One aspect of the present invention provides a method of fabricating an electronic device using nanowires, the method comprising the steps of: forming electrodes on a substrate; depositing a plurality of nanowires on the substrate including the electrodes; capturing an image of the substrate including the nanowires and the electrodes; drawing virtual connection lines for connecting the nanowires with the electrodes on the image using an electrode pattern simulated through a computer program, after capturing the image; coating an E-beam photoresist on the substrate; removing the photoresist from regions corresponding to the virtual connection lines and the electrode pattern using E-beam lithography; depositing a metal layer on the substrate after removing the photoresist from the regions of the virtual connection lines; and removing remaining photoresist from the substrate using a lift-off process.

The step of depositing the nanowires may comprise depositing the nanowires mixed with an organic solvent on the substrate; and evaporating the organic solvent to adhere the nanowires to the substrate.

The step of depositing the nanowires may further comprise etching foreign materials remaining in the nanowires after evaporating the solvent. The organic solvent may comprise one of alcohol and isopropyl-alcohol. The electrode may be formed by photolithography and may comprise a pad and a lead.

The substrate may be formed of one of silicon, polycarbonate, quartz, GaAs, InP, and glass. The electrode and the metal layer may be formed of one of silver, gold, platinum, rhodium, iridium, ruthenium, palladium, and conductive oxide. The nanowire may comprise a single nanowire or multiple nanowires. The method may further comprise the step of performing thermal treatment to bring the nanowires into ohmic contact with the electrodes, after removing the photoresist through the lift-off process.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. Therefore, the following embodiments are described in order for this disclosure to be complete and enabling to those of ordinary skill in the art.

Figure 1A:
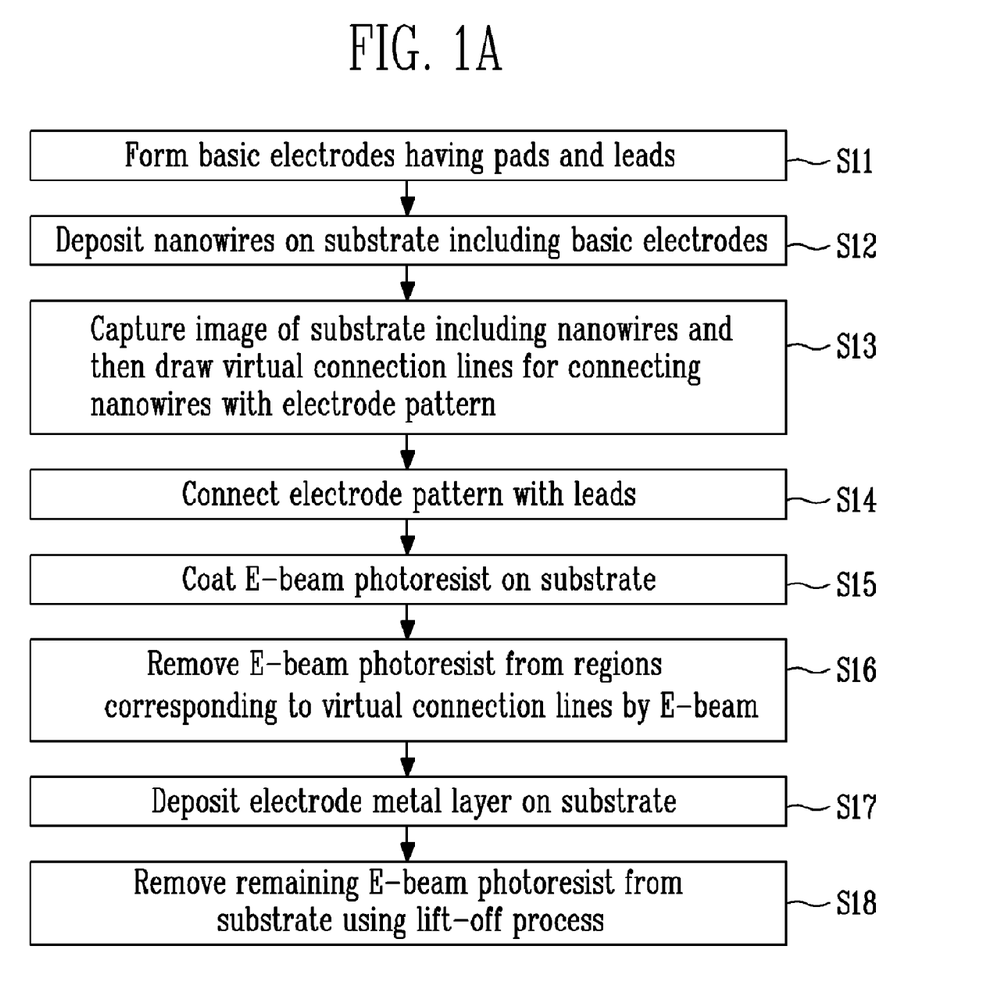
FIG. 1A is a flowchart showing a procedure of fabricating an electronic device using nanowires in accordance with the present invention and FIG. 1B shows perspective views of the electronic device according to a fabrication process sequence of FIG. 1A.
Figure 1B:
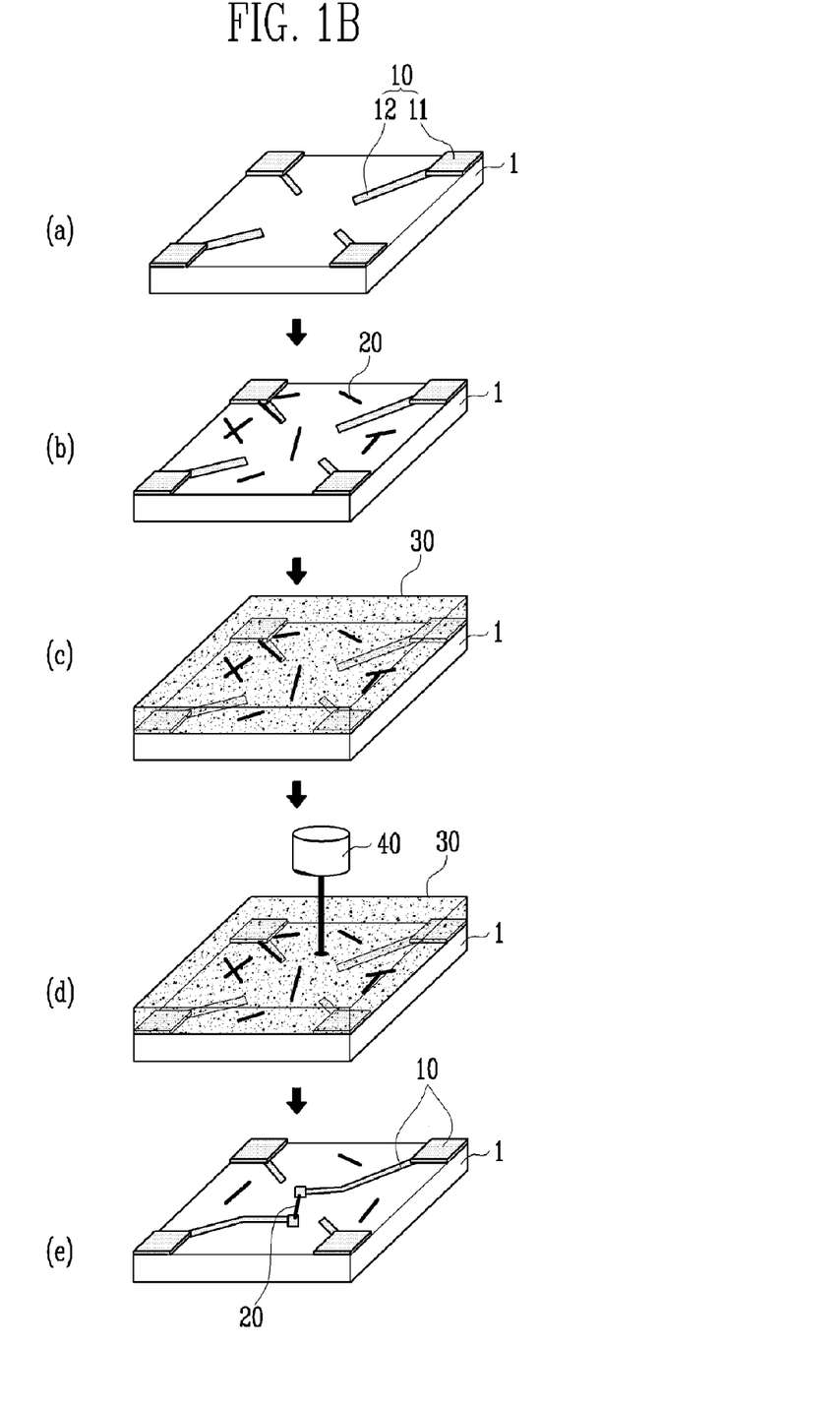

FIG. 1A is a flowchart showing a procedure of fabricating an electronic device using nanowires in accordance with the present invention, and FIG. 1B shows perspective views of the electronic device according to a fabrication process sequence of FIG. 1A.

Referring to FIGS. 1A and 1B, basic electrodes 10 are first formed on a substrate 1 in order to fabricate the electronic device using nanowires according to the present embodiment (S11). The substrate 1 is made of silicon, polycarbonate, quartz, GaAs, InP, or glass. The basic electrode 10 includes a pad 11 and a lead 12. As shown in FIG. 1B(a), the pad 11 is tetragon shaped and the lead 12 is formed in a linear form at a corner of each pad 11.

A plurality of nanowires 20 are deposited on the substrate 1 having the basic electrodes 10 (S12 in FIG. 1B(b)). Depositing the nanowires on the substrate 1 is carried out by mixing the nanowires 20 with an organic solvent to make an organic solution, depositing the organic solution which contains the nanowires 20 on the substrate 1, and then evaporating the organic solvent from the substrate 1 under a suitable temperature (e.g., 30~40° C.). The nanowires 20 remaining on the substrate 1 may be used as a single nanowire or multiple nanowires. In this case, the organic solvent includes ethanol or isopropyl-alcohol. Meanwhile, although not shown, an etching process is further conducted to remove any remaining organic residue or amorphous layer after evaporating the organic solvent.

An image of the substrate 1 having the basic electrodes 10 and the nanowires 20 is captured by a high-magnification microscope, a portion of the image including the nanowires 20 is stored as an image file, and virtual connection lines for connecting the nanowires 20 with the electrode pattern simulated through a computer program are drawn by using the electrode pattern (S13). The electrode pattern and the virtual connection line are then drawn, the simulated electrode pattern and the captured image file are called upon to connect the leads 12 of the basic electrodes 10 thereto (S14).

After the image of the substrate 1 having the nanowires and the image including the simulated electrode patterns are made, the substrate 1 is coated with an E-beam photoresist 30 (S15 in FIG. 1B(c)). Here, the substrate is spin-coated with the E-beam photoresist 30. After the substrate 1 is coated with the E-beam photoresist 30, the photoresist 30 is removed from the virtual connection line region by the E-beam 40 by referring to the image including the virtual connection lines (S16 in FIG. 1B(d)).

After the photoresist 30 is removed from the virtual connection line region, the entire surface of the substrate 1 is coated with an electrode metal layer (S17). The remaining E-beam photoresist 30 is then all removed through a lift-off process (S18). The basic electrodes 10 and the electrode metal layer are formed of silver, gold, platinum, rhodium, iridium, ruthenium, palladium, or conductive oxide.

Although not shown in this embodiment, post heat treatment may be carried out to change a Schottky contact formed due to a difference in work function between the nanowire and the metal electrode into an ohmic contact after the preceding processes are all performed. Through the above processes, the electronic device with the nanowires can be easily fabricated.

The method of fabricating the electronic device using the nanowires will now be described in more detail with reference to the accompanying drawings.

Figure 2:
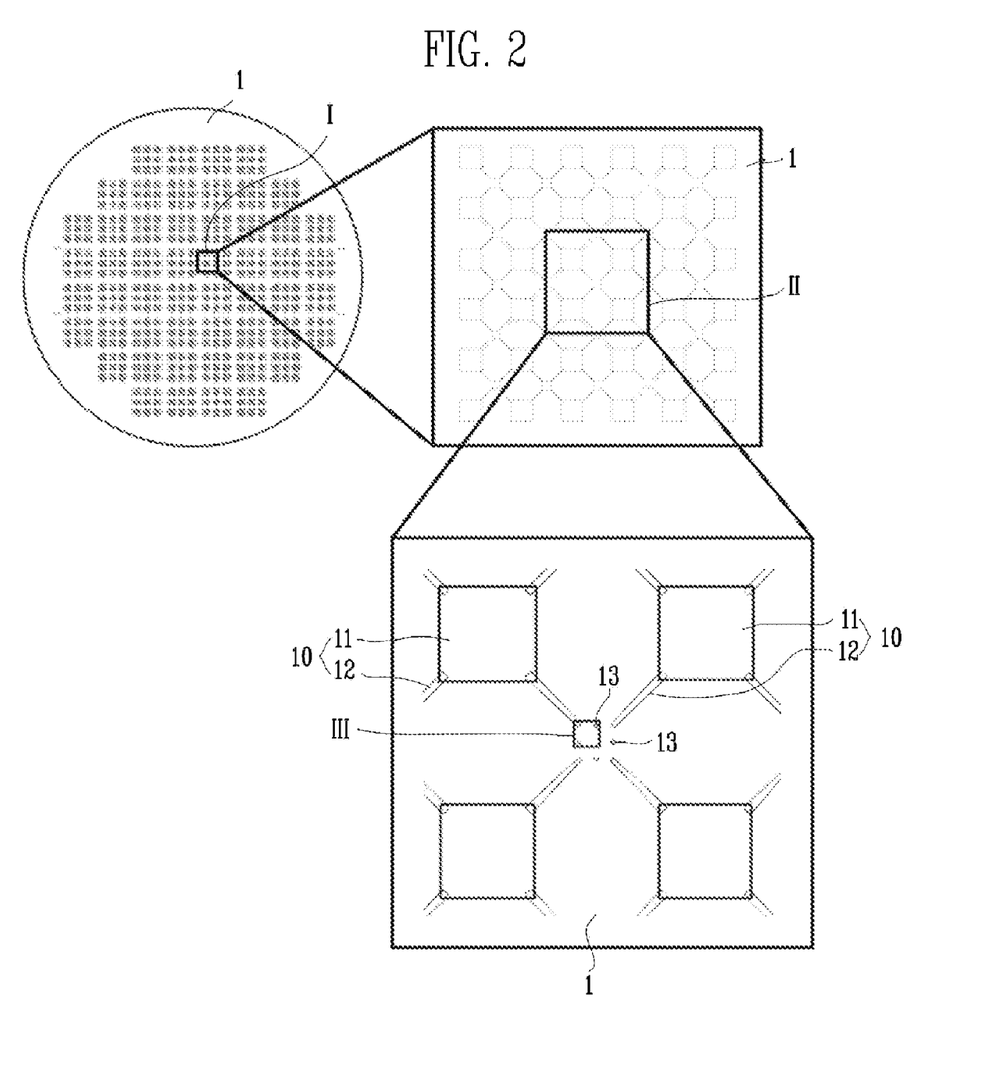
FIG. 2 is a stepwise enlarged top view illustrating an electrode pattern including pads and leads shown in FIG. 1B(a)
Figure 3A:
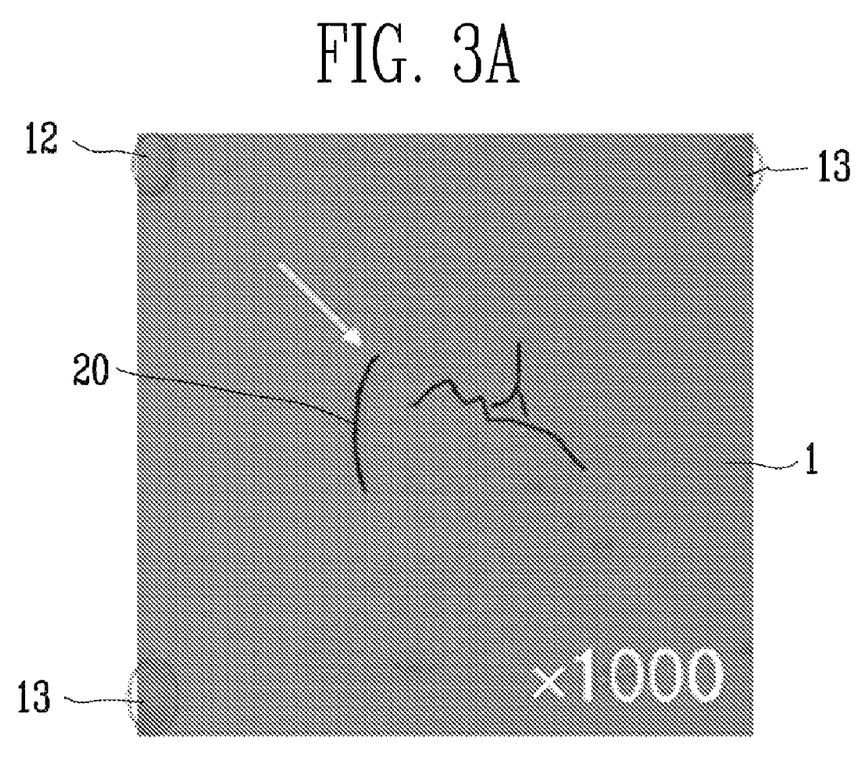
FIG. 3A shows an enlarged microscopic image of a region III of FIG. 2 after depositing the nanowires on the substrate including electrodes each including a pad and a lead.
Figure 3B:
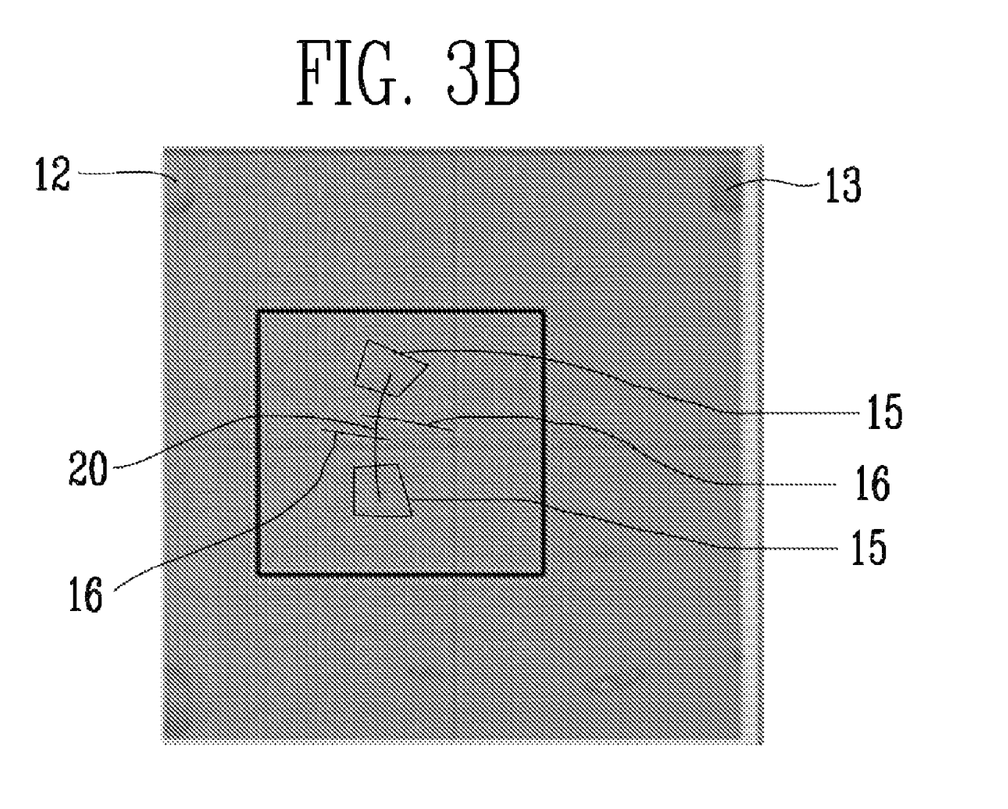
FIG. 3B shows a microscopic image including an electrode pattern simulated by a computer program and the deposited nanowires.
Figure 3C:
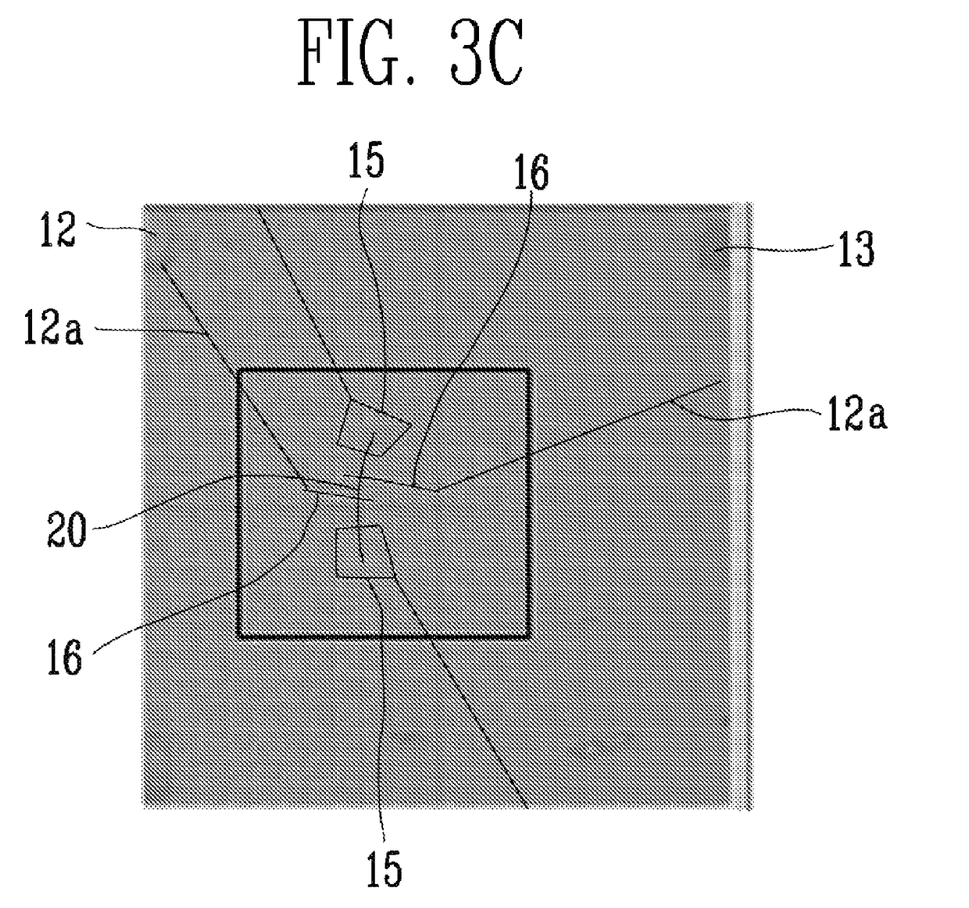
FIG. 3C shows a microscopic image including the simulated electrode pattern connected with leads.

FIG. 2 is a stepwise enlarged top view illustrating an electrode pattern including pads and leads shown in FIG. 1B(a). FIG. 3A shows an enlarged microscopic image of a region III of FIG. 2 after depositing the nanowires on the substrate including electrodes each including a pad and a lead, and FIG. 3B shows a microscopic image including an electrode pattern simulated by a computer program and the deposited nanowires. FIG. 3C shows a microscopic image including the simulated electrode pattern connected with leads, and FIG. 3D shows a microscopic image of the electronic device completed through a lift-off process after the procedure of FIGS. 3A through 3C.

Referring to FIG. 2, the basic electrodes 10 are formed on the substrate 1. Referring to a region II enlarged from a region I of FIG. 2, the basic electrodes 10 are arranged regularly on the substrate 1 and a lead 12 is connected to each corner of the pad 11 constituting the basic electrode 10. Four basic electrodes 10 are included in the region II. The four leads 12 meet at a center among the four basic electrodes 10. A mark 13 is formed between the adjacent leads 12 for indicating positions of the leads. As previously mentioned in the preceding step, the nanowires mixed with the organic solvent are deposited on the entire surface of the substrate having the above structure. The organic solvent includes alcohol or isopropyl-alcohol.

FIG. 3A shows an enlarged microscopic image of a region III of FIG. 2 after depositing the nanowires on the substrate including electrodes each including a pad and a lead. In FIG. 3A, the image includes an end of the lead 12, two marks 13 for position indication, and the nanowires 20 deposited on the substrate 1. Referring to FIGS. 3B and 3C, the image captured by the microscope is called upon through the computer program and the electrode pattern is drawn including the deposited nanowires 20, the virtual electrodes (source and drain electrodes) 15, and the virtual connection electrodes 16. In this embodiment, the electrode 15 is tetragon shaped and the connection lines 20 are connected to the nanowires 20. The virtual connection electrode 16 is connected between the nanowire 20 and the electrode 15 and then, the electrode 15 is connected to the lead 12 formed on the substrate 1 via additional connection line 12a that connects the lead 12 with the virtual connection electrode 16.

Figure 3D:
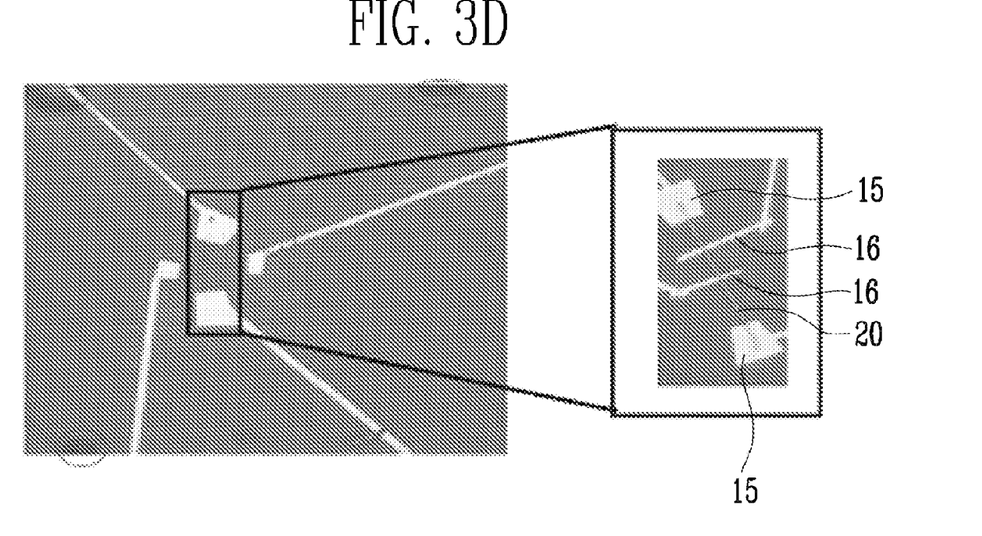
FIG. 3D shows a microscopic image of the electronic device completed through a lift-off process after the procedure of FIGS. 3A through 3C.

FIG. 3D shows an enlarged photograph of the resultant electronic device fabricated by the aforementioned procedure. As illustrated in FIG. 3D, the nanowire 20 is connected to the source and drain electrodes 15, and the electrodes 16 having an additional connection line are connected to the nanowire 20.

Figure 4:
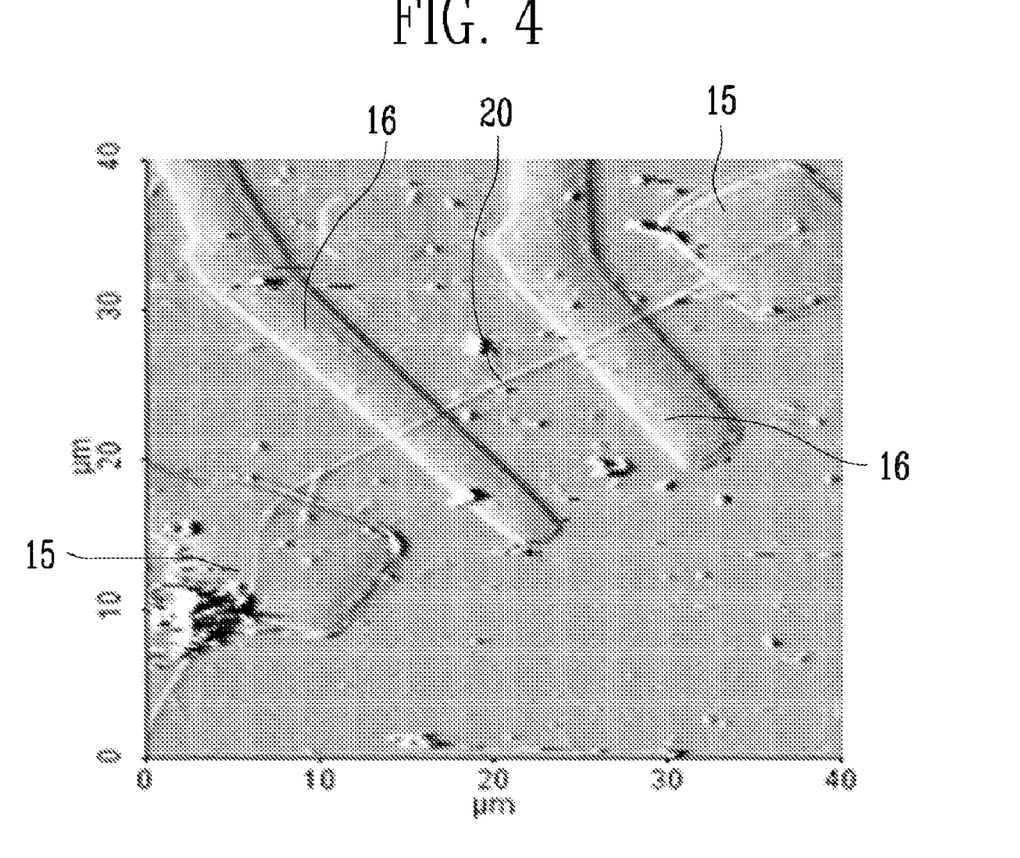
FIG. 4 is an enlarged microscopic view of the electronic device with the nanowires fabricated through the process according to the present invention.

FIG. 4 is an enlarged microscopic view of the electronic device with the nanowires fabricated through the process according to the present invention. Referring to FIG. 4, a fabricated electronic device with nanowires observed by the AFM is shown, and the nanowires formed between the electrode patterns, the connection lines connecting the nanowires, and the nanowires of the basic electrodes are shown in an enlarged view.

According to the present invention, the time and cost associated with fabricating electronic devices with nanowires can be reduced because the number of E-beam processing steps remarkably decreases compared to the conventional method that fabricates electronic devices only by means of the E-beam lithography processes. After calling upon an image of the substrate having nanowires on a computer program, the electronic devices are fabricated with reference to the substrate image, thereby enhancing the product yield. Moreover, it is possible to fabricate electronic devices with a single nanowire or multiple nanowires, as well as evaluating a variety of electrical characteristics of the nanowires in the case of the single nanowire.

While the invention has been shown and described with reference to certain exemplary embodiments thereof, it will be understood by those skilled in the art that various changes in form and detail may be made therein without departing from the spirit and scope of the invention as defined by the appended claims.

What is claimed is:

1. A method of fabricating an electronic device using nanowires, the method comprising the steps of:
   forming electrodes on a substrate;
   depositing at least one nanowire on the substrate including the electrodes, the nanowire, taken from a top view of the substrate, being spaced apart from the electrodes without overlapping the electrodes;
   after depositing the nanowire, capturing an image of the substrate including the nanowire and the electrodes;
   after capturing the image, drawing virtual connection lines for connecting the nanowire with the electrodes on the image using an electrode pattern simulated through a computer program;
   after drawing the virtual connection lines, coating an E-beam photoresist on the substrate;
   after coating the photoresist, removing the photoresist from regions of the substrate that correspond to the virtual connection lines using E-beam lithography;
   after removing the photoresist from said regions, depositing a metal layer on the substrate;
   after depositing the metal layer, removing remaining photoresist from the substrate using a lift-off process,
   wherein:
   the metal layer includes a connection electrode and a connection line;
   taken from the top view of the substrate, the connection electrode is spaced apart from the electrodes and at least a portion of the connection electrode overlaps the nanowire; and
   the connection line, taken from the top view of the substrate, extends from the connection electrode to one of the electrodes.

2. The method of claim 1, wherein the step of depositing the nanowire comprises:
   depositing the nanowire mixed with an organic solvent on the substrate; and
   evaporating the organic solvent to adhere the nanowire to the substrate.

3. The method of claim 2, wherein the step of depositing the nanowire further comprises etching foreign materials remaining in the nanowire after evaporating the organic solvent.

4. The method of claim 3, wherein the organic solvent comprises alcohol or isopropyl-alcohol.

5. The method of claim 1, wherein the electrode is formed by photolithography and comprises a pad and a lead.

6. The method of claim 1, wherein the substrate is formed of one of silicon, polycarbonate, quartz, GaAs, InP, and glass.

7. The method of claim 1, wherein the electrode and the metal layer are formed of one of silver, gold, platinum, rhodium, iridium, ruthenium, palladium, and conductive oxide.

8. The method of claim 1, wherein the nanowire comprises a single nanowire or multiple nanowires.

9. The method of claim 1, further comprising the step of performing thermal treatment to bring the nanowire into ohmic contact with the electrodes, after removing the photoresist using the lift-off process.

10. The method of claim 1, the virtual connection lines include a virtual connection electrode and a virtual connection line;
    the connection electrode is disposed on the substrate at a location corresponding to a location at which the virtual connection electrode is disposed on the captured image; and
    the connection line is disposed on the substrate at a location corresponding to a location at which the virtual connection line is disposed on the captured image.

11. The method of claim 1, wherein:
    the virtual connection lines include a virtual source electrode and a virtual drain electrode; and
    the metal layer further includes a source electrode and a drain electrode, the source electrode being disposed on the substrate at a location corresponding to a location at which the virtual source electrode is disposed on the captured image, the drain electrode being disposed on the substrate at a location corresponding to a location at which the virtual drain electrode is disposed on the captured image.

12. The method of claim 1, wherein the metal layer electrically connects the nanowire and said one of the electrodes.

* * * * *